(12) United States Patent
Kim

(10) Patent No.: US 7,538,009 B2
(45) Date of Patent: May 26, 2009

(54) METHOD FOR FABRICATING STI GAP FILL OXIDE LAYER IN SEMICONDUCTOR DEVICES

(75) Inventor: Sung Rae Kim, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 153 days.

(21) Appl. No.: 11/616,305

(22) Filed: Dec. 27, 2006

(65) Prior Publication Data

US 2007/0148903 A1 Jun. 28, 2007

(30) Foreign Application Priority Data

Dec. 28, 2005 (KR) ................ 10-2005-0131447

(51) Int. Cl.
*H01L 21/20* (2006.01)
(52) U.S. Cl. .............. 438/424; 438/432; 438/435; 438/437; 438/612; 438/702; 257/E21.279; 257/E21.546; 257/E21.547; 257/E21.548; 257/E21.549
(58) Field of Classification Search ............. 438/735, 438/424, 432, 435, 437, 612, 702, 743; 257/E21.279, 257/546, 547, 548, 549
See application file for complete search history.

(56) References Cited

U.S. PATENT DOCUMENTS

| 5,858,858 | A | * | 1/1999 | Park et al. ............... 438/424 |
| 5,869,384 | A | * | 2/1999 | Yu et al. ................. 438/431 |
| 6,033,970 | A | * | 3/2000 | Park ....................... 438/435 |
| 6,180,467 | B1 | * | 1/2001 | Wu et al. ................. 438/296 |
| 6,180,490 | B1 | * | 1/2001 | Vassiliev et al. .......... 438/424 |
| 6,207,535 | B1 | * | 3/2001 | Lee et al. ................. 438/435 |
| 6,339,004 | B1 | * | 1/2002 | Kim ........................ 438/296 |
| 6,465,044 | B1 | * | 10/2002 | Jain et al. ............. 427/255.37 |
| 6,653,204 | B1 | * | 11/2003 | Wu et al. ................. 438/435 |
| 6,855,616 | B2 | * | 2/2005 | Lee ......................... 438/424 |
| 2005/0170606 | A1 | * | 8/2005 | Fu et al. .................. 438/424 |

FOREIGN PATENT DOCUMENTS

| KR | 10-1998-0033769 | 3/2000 |
| KR | 10-2001-0086321 | 7/2003 |

* cited by examiner

*Primary Examiner*—Michael S Lebentritt
(74) *Attorney, Agent, or Firm*—Saliwanchik, Lloyd & Saliwanchik

(57) ABSTRACT

A method for fabricating an STI gap fill oxide layer in a semiconductor device is provided. The method can include: forming a shallow trench for forming an STI on a semiconductor substrate; forming an STI liner oxide layer in the shallow trench for the STI; depositing an APCVD oxide layer at an upper portion of the STI liner oxide layer for an oxide layer gap fill in the shallow trench of the STI; d) performing a densifying annealing process to densify the APCVD oxide layer; and depositing an HDP-CVD oxide layer at an upper portion of the APCVD oxide layer so that the STI shallow trench is completely gap-filled.

8 Claims, 2 Drawing Sheets

METHOD FOR FABRICATING STI GAP FILL OXIDE LAYER IN SEMICONDUCTOR DEVICES

RELATED APPLICATION(S)

This application claims priority under 35 U.S.C. §119(e) of Korean Patent Application No. 10-2005-0131447 filed Dec. 28, 2005, which is incorporated herein by reference in its entirety.

FIELD OF THE INVENTION

The present invention relates to a method for fabricating an STI gap filled oxide layer in a semiconductor device.

BACKGROUND OF THE INVENTION

Recently, as the degree of integration in semiconductor devices increases a shallow trench isolation (referred to as 'STI' hereinafter) structure has been used as a device isolation structure so as to improve a device isolation characteristic of the semiconductor devices.

The STI structure is a technology that forms a trench having a predetermined depth on a semiconductor substrate, deposits an oxide layer into the trench by a chemical vapor deposition (CVD), and removes any unnecessary oxide layer by a chemical mechanical polishing (CMP) process, thereby forming a device isolation layer. Since the STI structure has a better isolation property and smaller occupied area in comparison with a local oxidation of silicon (LOCOS) structure, it has been widely employed for highly integrated semiconductor devices. In particular, the LOCOS structure involves selectively growing a thick oxide layer on a semiconductor substrate to form a device isolation layer.

Conventionally, a plasma oxide layer or an undoped silicate glass (USG) layer formed by atmospheric pressure chemical vapour deposition (APCVD) was used to fill an STI trench. However, as a pattern size of a device is reduced, a method for filling the trench with a high density plasma chemical vapour deposition (HDP-CVD) oxide layer has been proposed.

The process for manufacturing an STI gap fill oxide layer during a formation of an STI is generally performed by an APCVD. The WJ1000/1500 has been the APCVD equipment most often used. WJ equipment for performing the APCVD process carries out an STI gap fill process in a belt manner using four injectors.

Referring to FIG. 1, a void 200 can occur in the related art STI gap fill oxide layer due to a surface reaction dependence of the gap fill oxide layer with the STI liner oxide layer during an STI CMP and subsequent wet clean process. Moreover, an incomplete interface layer damages a center part of the STI gap fill oxide layer. Accordingly, during a formation of a gate of the semiconductor device, poly oxides remain at the damage part of the STI gap fill oxide layer to deteriorate the reliability of the semiconductor device.

BRIEF SUMMARY

Accordingly, embodiments of the present invention are directed to a method of fabricating an STI gap fill oxide layer in a semiconductor device that substantially obviates one or more problems due to limitations and/or disadvantages of the related art.

An object of embodiments of the present invention is to provide a method of fabricating an STI gap fill oxide layer in a semiconductor device, which may solve an incomplete state between interface layers of an STI gap fill oxide layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings To achieve these objects and other advantages and in accordance with the purpose of the invention, as embodied and broadly described herein, there is provided a method for fabricating an STI gap fill oxide layer in a semiconductor device, comprising: (a) forming a shallow trench for forming an STI on a semiconductor substrate; (b) forming an STI liner oxide layer in the shallow trench for the STI; (c) depositing an APCVD oxide layer at an upper portion of the STI liner oxide layer for an oxide layer gap fill in the shallow trench of the STI; (d) performing a densifying annealing process to densify the APCVD oxide layer; and (e) depositing an HDP-CVD oxide layer at an upper portion of the APCVD oxide layer so that the STI shallow trench is completely gap-filled.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for fabricating an STI gap fill oxide layer in a semiconductor device according to an embodiment of the present invention will be described with reference to the accompanying drawings.

In the description of an embodiment of the present invention, when something is formed "on" each layer, the "on" includes the concepts of "directly and indirectly".

First, an STI shallow trench can be formed by forming a moat pattern and performing an etching process. When the STI shallow trench is formed, a thermal treatment can be carried out in an entire surface in the STI shallow trench to form an STI liner oxide layer.

Next, an APCVD oxide layer can be deposited in the STI shallow trench for performing an STI oxide layer gap fill process.

Figure 1:
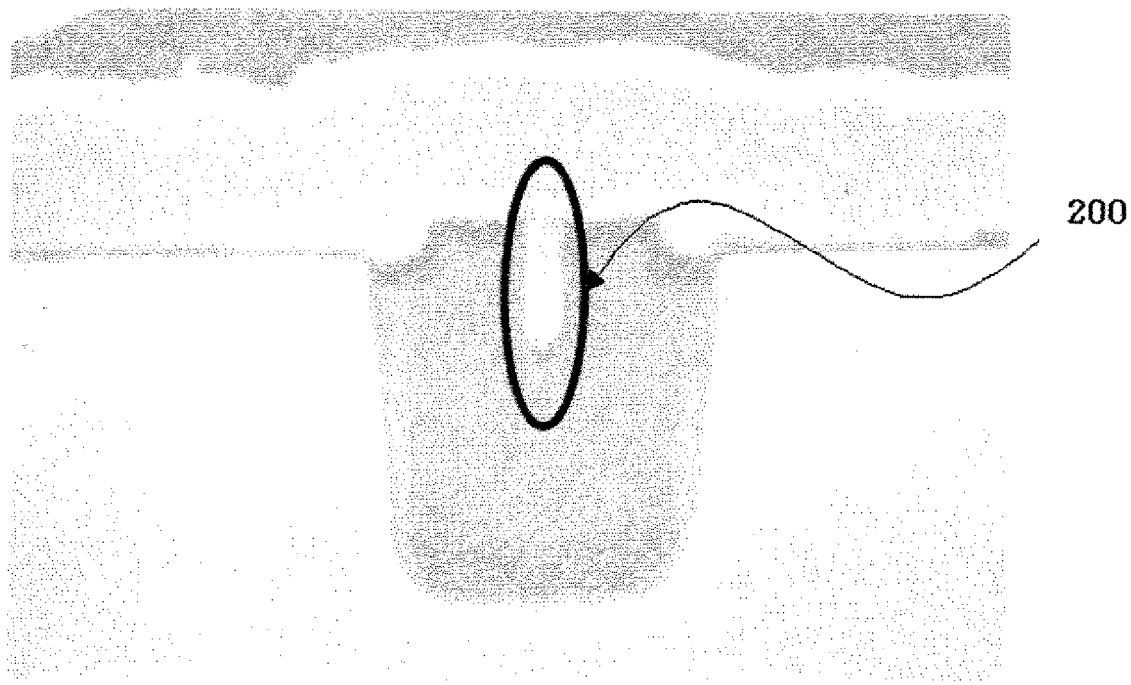
FIG. 1 is a view showing a void generated in an STI gap fill oxide layer according to the related art.
Figure 2:
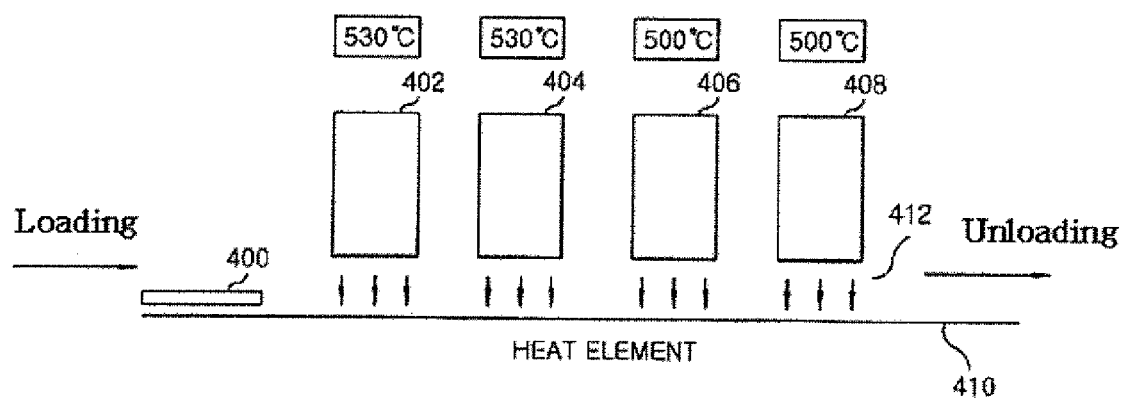
FIG. 2 is a view showing a deposition procedure of an STI gap fill oxide layer on a semiconductor substrate by an APCVD oxide layer deposition device according to an embodiment of the present invention.

Referring to FIG. 2, the APCVD oxide layer deposition process in the STI shallow trench can be performed using WJ APCVD equipment. Here, the WJ equipment includes four injectors 202, 204, 206, and 208 for APCVD oxide layer deposition. Hereinafter, an APCVD oxide layer deposition process by the WJ equipment will be described in detail.

Referring to FIG. 2, a semiconductor substrate 400 subjected to the STI oxide film gap fill process can be loaded on a belt 410 sequentially moving below the four injectors 402, 404, 406 and 408 of the WJ equipment. The belt 410 can move the substrate 400 sequentially below the injectors to perform the APCVD oxide film deposition.

That is, as shown in FIG. 2, the APCVD WJ equipment performs an oxide layer gap fill process in the STI shallow trench on the semiconductor substrate using the four injectors 402, 404, 406 and 408 for APCVD oxide layer deposition.

Figure 3:
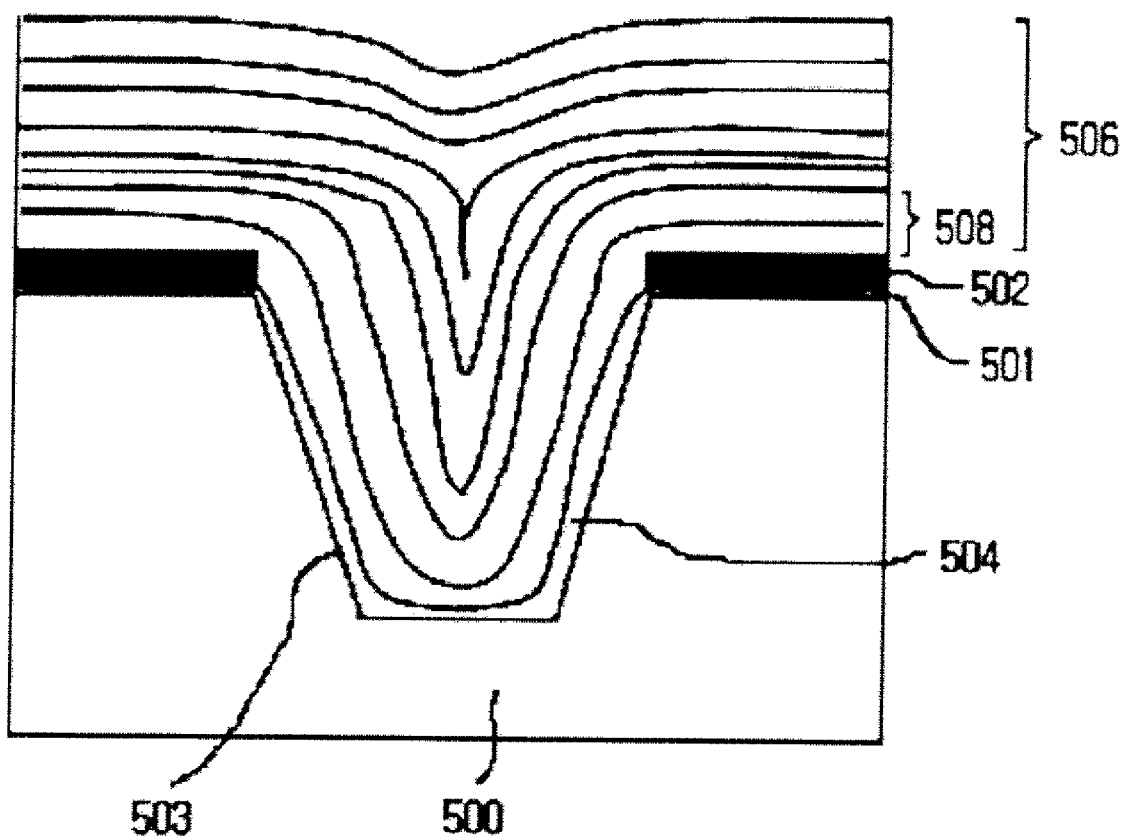
FIG. 3 is a view showing a laminate construction of an STI gap fill oxide layer in an STI shallow trench through an APCVD oxide layer deposition device according to an embodiment of the present invention.

Accordingly, as shown in FIG. 3, the STI shallow trench on the semiconductor substrate is oxide-gap-filled to a lower portion of the STI liner oxide layer 504 in such a way that a thin APCVD oxide layer 506 is formed in a plurality of laminates.

In the APCVD oxide layer deposition process being performed by the plurality of injectors 402, 404, 406, and 408, a center of the gap fill oxide layer in the STI shallow trench 503 may be damaged because of incompleteness between interface layers based on the surface reaction dependence between an STI liner oxide layer 504, which is a first layer in the STI shallow trench 503, during subsequent processes of STI manufacturing. Further, polyoxides remain at the damaged portion of the STI oxide layer to deteriorate the reliability of the semiconductor device. Here, the subsequent processes include an STI-chemical mechanical polishing (CMP), a moat wet etch, and a subsequent wet clean.

Accordingly, to minimize the above mentioned damage, a preferred embodiment of the present invention utilizes different temperatures for the APCVD process. Referring to FIG. 2, an oxide layer deposition temperature of first and second injectors 402 and 404 can be set to be higher than that of the third and fourth injectors 406 and 408. In addition, the concentration of an $O_3$ TEOS gas 412 flown to deposit the APCVD oxide layer in each injector can be set to be 80 g/m$^3$, which is less than that of the related art.

Accordingly, the surface reaction dependence between the first/second laminate APCVD oxide layer 508 and the STI liner oxide layer 504 may be increased, which improves an APCVD oxide layer gap fill property in the STI shallow trench.

Then, after the substrate 400 is passed through the fourth injectors 402, 404, 406, and 408 for APCVD oxide layer deposition in the WJ equipment, a densifying annealing process can be performed to the APCVD oxide layer in the STI shallow trench in which the four APCVD oxide layers are deposited to densify the APCVD oxide layer. At this time, the densifying annealing process can be performed at a temperature of approximately 1000° C. In an embodiment, the APCVD oxide layer of a laminate structure having 4 layers formed through the 4 injectors 402, 404, 406, and 408 can be formed to have a thickness ranging from 2500 to 5000 Å.

Thereafter, an oxide layer can be deposited at an upper portion of the densified APCVD oxide layer in the STI shallow trench by an HDP-CVD having an excellent gap fill property to complete an STI gap fill oxide layer.

A CMP can be performed for the STI gap fill oxide layer to expose a surface of a pad nitride layer 502 on the semiconductor substrate 500. Then, the pad nitride layer 502 and the pad oxide layer 501 can be removed by wet etch and washing processes to complete the STI process.

As illustrated earlier, according to an embodiment of the present invention, in the method for fabricating an STI gap fill oxide layer during a formation of an STI of a semiconductor device, when depositing an APCVD oxide layer with an STI shallow trench gap fill oxide layer, a deposition temperature of the APCVD oxide layer and $O_3$ TEOS concentration are set according to a surface reaction dependence between the APCVD oxide layer and the STI liner oxide layer. This can address a problem with an incomplete state between interface layers of an STI gap fill oxide layer, which may also inhibit a center part of the STI gap fill oxide layer from being damaged during STI CMP and subsequent wet washing, thereby enhancing the reliability of a device.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for fabricating an STI gap fill oxide layer for a semiconductor device, comprising:

forming a shallow trench for forming an STI on a semiconductor substrate;

forming an STI liner oxide layer in the shallow trench for the STI;

depositing an APCVD oxide layer on the STI liner oxide layer for an oxide layer gap fill in the shallow trench of the STI;

performing a densifying annealing process to densify the APCVD oxide layer; and depositing an HDP-CVD oxide layer on the APCVD oxide layer so that the STI shallow trench is completely gap-filled, wherein depositing the APCVD oxide layer comprises:

loading the semiconductor on a belt moving below a plurality of APCVD oxide layer deposition injectors; and sequentially depositing the APCVD oxide layer using the plurality of APCVD oxide layer deposition injectors, the APCVD oxide layer having a lamination structure corresponding to the number of the injectors, wherein the plurality of APCVD oxide layer deposition injectors includes first, second, third, and fourth injectors, which are installed along a moving path of the semiconductor loaded on the belt, wherein the first and second injectors perform an APCVD oxide layer deposition at a temperature higher than that of the third and fourth injectors to perform a surface reaction between first and second laminate APCVD oxide layers to the STI liner oxide layer.

2. The method according to claim 1, wherein the STI liner oxide layer is formed by a thermal treatment process.

3. The method according to claim 1, wherein the APCVD oxide layer deposition temperature of the first and second injectors is 530° C.

4. The method according to claim 1, wherein the APCVD oxide layer deposition temperature of the third and fourth injectors is 500° C.

5. The method according to claim 1, wherein a material of the APCVD oxide layer deposited by the injectors is $O_3$ TEOS.

6. The method according to claim 5, wherein the $O_3$ TEOS flown in the injectors has a concentration of 80 $g/m^3$.

7. The method according to claim 1, wherein the APCVD oxide layer of a laminate construction having four layers has a thickness ranging from 2500 to 5000 Å.

8. The method according to claim 1, wherein the densifying annealing process of the APCVD oxide layer is performed at a temperature of 1000° C.

* * * * *